United States Patent [19]

Mobley et al.

[11] Patent Number: 4,698,598

[45] Date of Patent: Oct. 6, 1987

[54] FM DEMODULATOR SYSTEM WITH THRESHOLD EXTENSION

[75] Inventors: Joseph G. Mobley, Dunwoody; David P. Womble, Doraville, both of Ga.

[73] Assignee: Scientific Atlanta, Inc., Atlanta, Ga.

[21] Appl. No.: 892,970

[22] Filed: Aug. 4, 1986

[51] Int. Cl.$^4$ .......................... H03D 3/00; H04B 1/10
[52] U.S. Cl. ..................................... 329/134; 329/136; 329/139; 329/168; 358/36; 358/167; 455/266; 455/307
[58] Field of Search ............... 329/110, 134, 136, 139, 329/168, 169; 358/160, 167, 36, 37, 38, 166, 21 R; 455/205, 210, 214, 266, 296, 307, 310, 311, 312

[56] References Cited

U.S. PATENT DOCUMENTS

| | | | |
|---|---|---|---|
| 4,101,837 | 7/1978 | Clayton, Jr. et al. | 329/134 X |
| 4,339,828 | 7/1982 | Chasek | 455/205 |
| 4,458,207 | 7/1984 | Favrean et al. | 329/136 |
| 4,563,651 | 1/1986 | Ohta et al. | 329/110 |
| 4,594,556 | 6/1986 | Ohta | 329/137 |

OTHER PUBLICATIONS

Ref. Data Radio Eng. 5th Ed., pp. 21-12 & 13, 1985.

*Primary Examiner*—Siegfried H. Grimm
*Attorney, Agent, or Firm*—Martin LuKacher

[57] ABSTRACT

A FM demodulator system which provides threshold extension by frequency selective phase modulation of the input FM signal in a band pass filter to reduce phase error between the input and output of the filter. The output of the filter is applied to an FM discriminator which provides a base band signal. This base band signal is applied to a frequency selective phase compensation network to derive a signal which phase modulates the band pass filter. The filter rejects uncorrelated thermal noise so as to effect threshold extension in the demodulator system.

7 Claims, 4 Drawing Figures

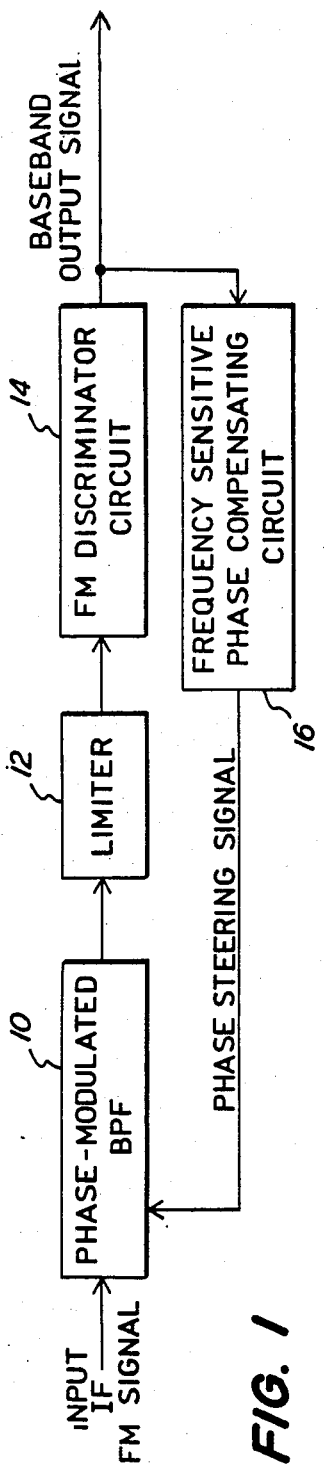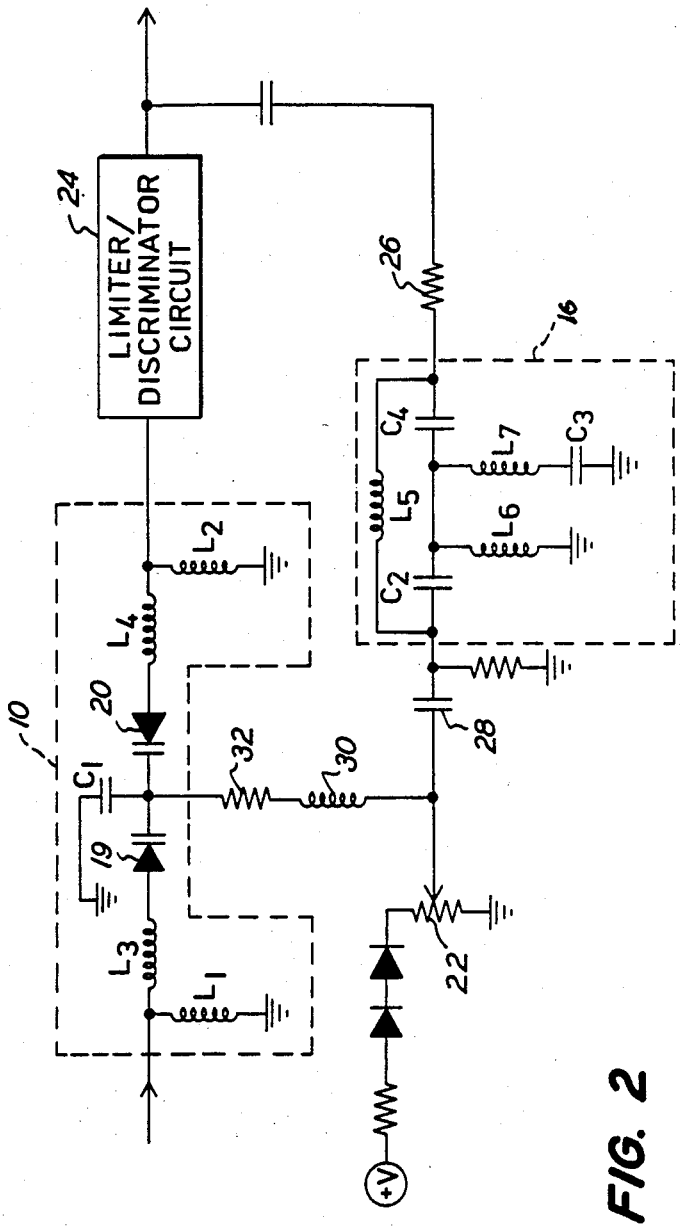
FIG. 1
FIG. 2

FM DEMODULATOR SYSTEM WITH THRESHOLD EXTENSION

DESCRIPTION

The present invention relates to signal threshold extension FM demodulation, and particularly to an FM demodulator system with threshold extension capability.

The invention is especially suitable for use in receivers used in those satellite communication systems where FM television signals are transmitted.

Threshold extension of FM signals has been obtained using various techniques, such as FM feedback with tracking filters tuned so that their center frequency tracks the instantaneous frequency of the FM signal. Such feedback techniques generally involve the use of regenerative limiters and voltage controlled oscillators. The latter technique is discussed in reference data for Radio Engineers, Fifth Edition, pages 21–12 and 21–13. Phase locked loop demodulators are also used in FM threshold extension. A survey of such techniques and a system using a regenerative limiter for threshold extension will be found in U.S. Pat. No. 4,101,837 issued to Clayton and Livaditis on Jul. 18, 1978. Circuits for improving FM threshold extension, of the type discussed above, are implemented using oscillating circuits, the performance of which may vary unpredictably because of instabilities which develop over time and with temperature variations. While such circuits have performed satisfactorily in many applications, they are more complex and critical in design than is desired.

It is an object of the present invention to provide an improved FM demodulator system with threshold extension which eliminates oscillating and regenerative circuits which can be unstable in frequency and amplitude response due to aging and environmental effects, and also to provide a system which can be implemented by circuitry less complex than that used in FM receivers which involve the use of oscillating and regenerative circuits.

It is another object of the present invention to provide an improved FM demodulator system which extends the FM threshold by rejecting noise, such as thermal noise, which is uncorrelated with the FM signal.

It is a further object of the present invention to provide an improved threshold extending FM demodulator system which allows the use of a filter of lower band width than that occupied by the effective spectrum of the FM signal and therefore has a smaller band width to noise than predetection filters conventionally used in FM receivers so that noise outside the band width can be reduced and threshold extension results.

It is a still further object of the present invention to provide an improved FM demodulator system which enables the use of a filter of narrower band width than that of the FM spectrum of interest for threshold extension by providing phase modulation in the filter, causing the phase of the output signal from the filter to track the phase of the FM input signal thereby precluding signal distortion and consequent degradation of the threshold by such a narrower band width filter.

Briefly described, a system for demodulating FM signals and providing threshold extension in accordance with the invention makes use of means for band pass filtering input FM signals to be demodulated and providing output signals. The band pass filtering means includes means for modulating the phase of the input FM signals in accordance with a steering signal. Means are provided including an FM discriminator for demodulating the output FM signals from the filter to provide demodulated signals. These demodulated signals are video base band signals when the input FM signal is a TV signal of higher frequency, for example from the intermediate frequency stages of the receiver incorporating the demodulating system. Means are provided in the demodulating system which are responsive to the output base band signal for providing a signal which tracks the phase of the input FM signal and applying this phase tracking signal to the filter as the steering signal. The steering signal providing means is implemented by a frequency sensitive phase compensating circuit. The band pass filter may have a band width less than the band width of the input FM signal. The phase modulating means is desirably a parametric phase modulating circuit in the band pass filter utilizing variable capacitor (varactor) diodes.

The foregoing and other objects, features and advantages of the invention as well as a presently preferred embodiment thereof will become more apparent from a reading of the following description in connection with the accompanying drawings in which:

FIG. 1 is a block diagram of a FM demodulating system embodying the invention;

FIG. 2 is a diagram similar to FIG. 1 containing schematic diagrams of the phase modulated band pass filter (BPF) and the frequency sensitive phase compensating circuit;

Figure 3:
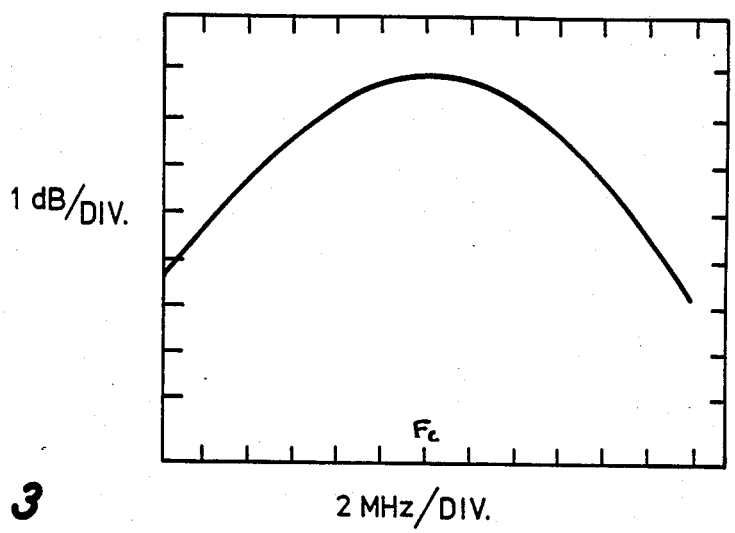
FIG. 3 is the response characteristic of the BPF.

Referring to FIG. 1 there is shown a system for demodulating FM signals, such as are obtained from the IF (intermediate frequency) circuits of a satellite receiver which receives TV signals from a satellite. The FM modulated signal passes through a band pass (band limiting) filter 10. This filter includes phase modulating means. The output signal from the filter 10 is applied to an envelope limiter 12. The output of the limiter 12 contains the FM carrier modulated by both the desired signal plus thermal noise. An FM discriminator circuit 14 detects both the FM modulation as well as the phase noise present at the discriminator input. The output of the discriminator is the demodulated video base band signal. This output is applied to a frequency selective phase compensating circuit 16. This circuit provides a phase compensated output as a phase steering signal to the phase modulating circuits of the band pass filter 10.

The filter 10 reduces the noise presented to the limiter 12 thereby providing FM threshold extension. The filter 10 is of lesser band width than the effective FM spectrum. The effective FM spectrum is meant to include the bandwidth occupied by the modulated FM carrier. The pass band of the filter 10 is lower than this spectrum and therefore lower than the band width of predetection filters which are conventionally used in FM receivers.

The filter 10 taken alone would cause severe signal distortion as well as threshold penalty, since it filters signal spectral content as well as unwanted thermal noise. The frequency sensitive phase compensating circuit insures that the FM spectrum will be accurately transmitted while the uncorrelated thermal noise is rejected. The steering signal from the phase compensating circuit 16 parametrically phase modulates the band pass filter so that the output of the filter phase tracks the input FM signal. This tracking is achieved using the output signal from the FM discriminator circuit 14. The phase of this signal is compensated in accordance with the frequency of the output signal from the discriminator 14 to provide a closed loop response which achieves thermal noise rejection without introducing signal distortion in the base band output signal from the discriminator circuit 14.

The phase modulated band pass filter 10 is shown in FIG. 2. It includes a double mesh filter circuit wherein the capacitance in the branches is provided primarily by varactor diodes 19 and 20. The diodes are biased to their operating point from a source of operating voltage indicated at +V. The voltage is adjustable using a potentiometer 22. The response of this filter is shown in FIG. 3.

Figure 4:
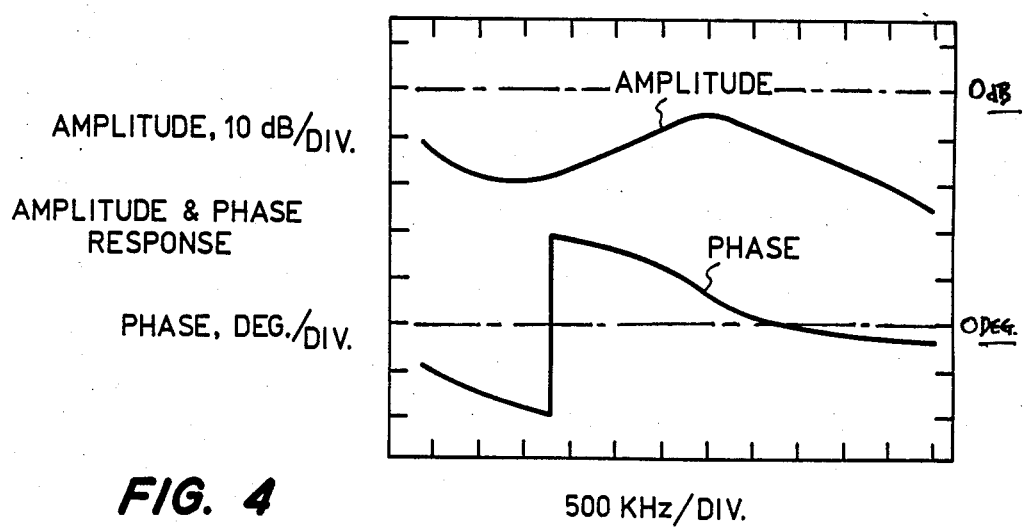
FIG. 4 shows the amplitude and phase response characteristics of the phase compensating circuit.

The limiter and discriminator 12 and 14 may be provided by an integrated circuit 24. The base band output signal from this circuit 24 is applied to the frequency sensitive phase compensating circuit 16 via a coupling resistor 26. The response of the circuit 16 versus frequency is illustrated in FIG. 4. The output of the circuit 16 is coupled through a capacitor 28, an inductor 30 and a resistor 32 to the node of the filter 10 to which the varactors 19 and 20 are connected.

The phase modulating effects of the steering signal on the output of the filter 10 as well as the characteristics of the filter 10 cause phase modulation which generates the required FM side bands filtered by the band pass filter characteristic. No oscillating circuitry is used so the design is stable and reliable with aging and temperature. The system is insensitive to variations in the level of the input FM signal since noise band width is not a function of input level. The following lists an exemplary complement of components for use in the system and their nominal values:

Diode 19—1.94 pF
Diode 20—1.94 pF
Inductor L1—6 nH (nano-Henry)
Inductor L2—6 nH (nano-Henry)
Inductor L3—46 nH (nano-Henry)
Inductor L4—46 nH (nano-Henry)
Inductor L5—100 μH (micro-Henry)
Inductor L6—0.47 μH (micro-Henry)
Inductor L7—0.22 μH (micro-Henry)
Capacitor C1—68 pF
Capacitor C2—1600 pF
Capacitor C3—2700 pF
Capacitor C4—1600 pF
Resistor 26—75 ohms
Resistor 32—56 ohms
Inductor 30—0.27 μH (micro-Henry)

From the foregoing description it will be apparent that there has been provided an improved system for demodulating FM signals and providing threshold extension. Variations and modifications in the herein described system, within the scope of the invention, will undoubtedly become apparent to those skilled in the art. Accordingly, the foregoing description should be taken as being illustrative and not in a limiting sense.

We claim:

1. A system for demodulating FM signals and providing threshold extension which comprises means for band pass filtering input FM signals to be demodulated and providing output FM signals, said band pass filtering means including means for modulating the phase of said input FM signals in accordance with a steering signal to generate FM sidebands and to provide output signals from said band pass filtering means, the phase of which tracks the phase of said input FM signals, means including an FM discriminator for demodulating said output FM signals to provide demodulated signals, and means responsive to said demodulated signals for providing a signal which tracks the phase of the input FM signals over their entire band width for applying said phase tracking signal to said filtering means as said steering signal.

2. The system according to claim 1 wherein said steering signal providing means comprises a frequency selective phase compensating circuit.

3. The system according to claim 1 wherein the band width of said filtering means is less than the effective spectrum of said input FM signals.

4. The system according to claim 1 wherein said demodulating means includes a limiter ahead of said discriminator.

5. The system according to claim 1 wherein said phase modulating means includes means for parametrically modulating the frequency response of said filtering means.

6. The system according to claim 5 wherein said parametric phase modulating means includes variable capacitance diode means, the capacitance of which is varied in response to said steering signal.

7. The system according to claim 1 wherein said input FM signals are TV signals and said output signals are video base band signals.

* * * * *